United States Patent [19]

Taguchi et al.

[11] Patent Number: 5,272,298
[45] Date of Patent: Dec. 21, 1993

[54] APPARATUS FOR VACUUM DEPOSITION OF SUBLIMATIVE SUBSTANCE

[75] Inventors: Toshio Taguchi; Younosuke Hoshi; Minoru Sueda; Susumu Kamikawa, all of Hiroshima, Japan

[73] Assignee: Mitsubishi Jukogyo Kabushiki Kaisha, Tokyo, Japan

[21] Appl. No.: 815,198

[22] Filed: Dec. 31, 1991

[30] Foreign Application Priority Data

Apr. 3, 1991 [JP] Japan .................... 3-070819

[51] Int. Cl.⁵ ................................ H05B 6/10
[52] U.S. Cl. ................ 219/10.491; 219/10.67; 219/10.79; 118/724; 118/726
[58] Field of Search ........... 219/10.491, 10.67, 10.57, 219/10.79; 118/720, 723, 724, 725, 726, 728, 729, 50.1

[56] References Cited

U.S. PATENT DOCUMENTS

| | | | |
|---|---|---|---|
| 2,743,306 | 4/1956 | Mark, Jr. | 219/10.491 |
| 2,875,556 | 3/1959 | Vigna et al. | 219/10.491 |
| 3,361,864 | 1/1968 | Vollmer et al. | 219/10.491 |
| 3,446,936 | 5/1969 | Hanson et al. | |
| 4,550,412 | 10/1985 | Holcombe et al. | 219/10.491 |
| 5,134,261 | 7/1992 | Larkin et al. | 219/10.491 |

FOREIGN PATENT DOCUMENTS 59-041472 3/1984 Japan .
766119 1/1957 United Kingdom .

OTHER PUBLICATIONS

RCA Technical Notes, vol. 19, No. 723, Jun. 1, 1967, P. Goldstein, "Apparatus for Evaporating Sublimable Materials".

Primary Examiner—Philip H. Leung
Attorney, Agent, or Firm—Wenderoth, Lind & Ponack

[57] ABSTRACT

A vacuum deposition apparatus has a slit-like nozzle formed in a receptacle accommodating a vacuum deposition material to effect uniform vacuum deposition of the material in the direction of width of a moving base material. The receptacle is made of graphite. An inductively heated body is disposed at the upper part of the receptacle and is provided with the small slit-like nozzle. The nozzle extends in the direction of width of the moving base material. The vaporized vacuum deposition material passes through the nozzle and is deposited uniformly in the direction of width of the moving base material.

3 Claims, 3 Drawing Sheets

APPARATUS FOR VACUUM DEPOSITION OF SUBLIMATIVE SUBSTANCE

BACKGROUND OF THE INVENTION

1. Industrial Field of the Invention

This invention relates to an apparatus for vacuum deposition of a sublimative substance such as $SiO_2$ or SiO provided with a device for heating the sublimative substance.

2. Description of the Prior Art

Heretofore, the formation of a thin film by the vacuum deposition of such a sublimative substance as $SiO_2$ or SiO on base material, such as paper or plastic film, has been carried out with an apparatus constructed as illustrated in FIG. 3.

With reference to FIG. 3, base material 1 in the form of a roll is set on a takeup reel 6 inside a vacuum deposition chamber 2 as connected to a takeup reel 5 via a deflector roll 3 and a cooling roll 4. After the interior of the vacuum deposition chamber 2 is evacuated by an exhaust pump unit 12 to a prescribed degree of vacuum, the base plate 1 is fed by the takeup reel 6, subjected to vacuum deposition effected by a vacuum deposition device 7 while being cooled on the cooling roll 4 so as to decrease the temperature elevated as the result of the application of heat during the vacuum deposition, and is rewound on the takeup reel 5.

The vacuum deposition device 7, as illustrated in FIG. 4, evaporates vacuum deposition material 8. The device 7 includes a plurality of receptacles 9 arranged in the direction of width of the base material 1 as spaced at given intervals, and a heating device 10 for heating the receptacles 9. The vapor of the vacuum deposition material 8 flows toward the moving base material 1.

When the vacuum deposition is effected with aluminum, for example, the receptacles 9 in the art are made of graphite. When the vacuum deposition is performed with such a sublimative substance as $SiO_2$ or SiO, however, no ideal material has yet been found for the receptacles 9.

During this vacuum deposition, the vacuum deposition material 8 which has been vaporized is sent flying not only directly upwardly but also obliquely outwardly from the vertical. To keep the vaporized vacuum deposition material from landing on the cooling roll 4 which is separated from the base material 1, an edge mask 11 forms a gap with each of opposite sides of the base material 1 and overlies opposite sides of the cooling roll.

Since the conventional device has the plurality of receptacles 9 spaced apart in the direction of width of the moving base material 1 as illustrated in FIG. 4, the thickness of the vacuum deposited film varies in the direction of width of the base plate 1. The vaporization may be caused by a reaction within the receptacles 9. For example, vacuum deposition materials such as $SiO_2$ and Si are placed in the receptacles and are caused to undergo the following reaction at an elevated temperature to produce SiO vapor.

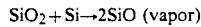

$SiO_2 + Si \rightarrow 2SiO$ (vapor)

Variations in the thickness of the vacuum deposited film occur in the direction of width depending on the positions of the receptacles 9 which establish the locations at which the above reaction occurs.

Incidentally, the speed of vaporization of the vacuum deposition material increases in accordance with increases in the temperature of the vacuum deposition material. When the vacuum deposition material is a fusible substance, the conventional heating device suffices because the vacuum deposition material is fused within the receptacles and is brought to a substantially uniform temperature therein. However, when the vacuum deposition material is a sublimative substance, since it is not fused but forms voids in the receptacle, the voids impair conduction of heat through the material and lower the apparent thermal conductivity thereof. The interior of the vacuum deposition material is characterized by temperature differences proportionate to the apparent thermal conductivity of the material. When part of the material, other than at the surface, is heated in the conventional device, the temperature of the receptacles is elevated to a point where problems occur. That is, the receptacles wear owing to the reaction between the receptacles and the vacuum deposition material.

SUMMARY OF THE INVENTION

In view of the state of the art described above and for the purpose of overcoming the drawbacks encountered in the prior art as described above, objects of the present invention are to provide a vacuum deposition apparatus for a sublimative substance, which apparatus enables the sublimative substance to be uniformly vacuum-deposited on a base material and, at the same time, precludes the aforementioned problem of the wear of the receptacles due to the reaction between the sublimative substance and the material of the receptacles.

The first object is achieved in an apparatus for vacuum-depositing a sublimative substance by covering the upper surface of a receptacle for accommodating the vacuum deposition material with an inductively heatable body made of graphite, providing said inductively heatable body in the central part thereof with a slit-like nozzle having a cross section smaller than the surface area of the vacuum deposition material held in the receptacle and, at the same time, surrounding said inductively heatable body with an induction heating coil.

The second object of the present invention can be achieved in the vacuum deposition apparatus by forming a SiC film on an inner surface of said receptacle.

Owing to the provision of the receptacle with the slit-like nozzle having a cross section smaller than the surface area of the material at which vaporization occurs within the receptacle, the vapor of the vacuum deposition material is accelerated by the nozzle and ejected at a flow rate uniform in the direction of width.

The upper surface of the receptacle for accommodating vacuum deposition material is covered with the inductively heatable body made of graphite as opposed to the surface of the vacuum deposition material inside the receptacle, and this inductively heatable body is surrounded with the induction heating coil. Owing to this construction, the surface is directly heated radially thereover and the latent heat of vaporization is compensated for. Therefore, the highest temperature that is registered through the entire volume of the vacuum deposition material occurs at the surface of the vacuum vapor deposition material.

Since the temperature of the material forming the slit-like nozzle is higher than the temperature of the surface at which vaporization occurs, the possibility of the vapor of the vacuum deposition material being condensed on the inner surface of the slit-like nozzle is nil.

The SiC film, which is formed on the inner surface of the receptacle, enables the vapors of SiO, $SiO_2$, etc. to be generated while curbing the possible effect of the generation of other gases.

Other objects and features of the present invention will become apparent from the following description of preferred embodiments of the invention, as illustrated in the accompanying drawings.

DETAILED DESCRIPTION OF THE PREFERRED EMBODIMENTS

Figure 1A:
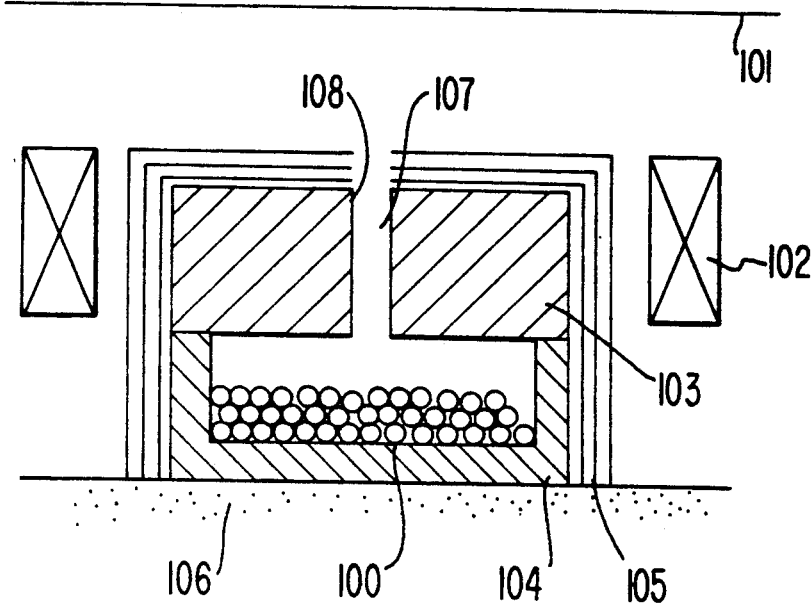
FIGS. 1(a)-1(c) illustrate one embodiment of an SiO vaporizing device according to the present invention, FIG. 1(a) being a schematic diagram, partly in section, of the SiO vaporizing device, FIG. 1(b) being a plan view of an induction heater shown in FIG. 1(a), and FIG. 1(c) being a side view of the induction heater.
Figure 1B:
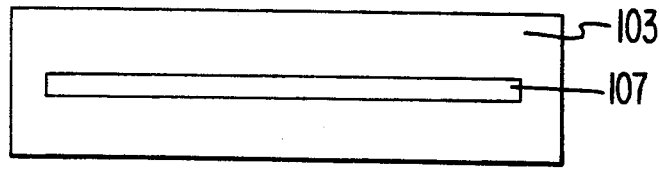
Figure 1C:
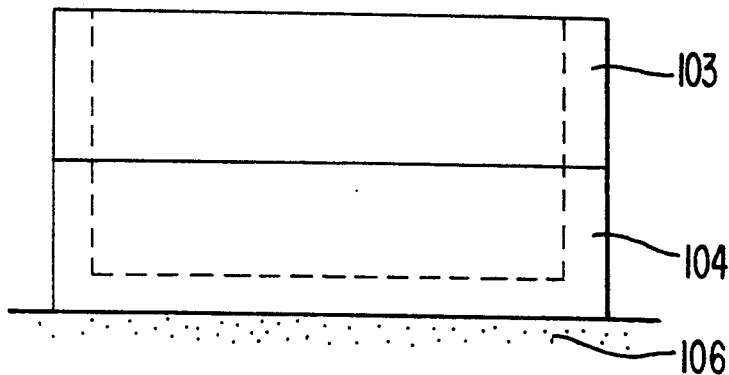

A vacuum deposition apparatus for a sublimative substance as one embodiment of this invention is illustrated in FIGS. 1(a)-1(c). The embodiment will be described specifically below with reference to this diagram.

In FIGS. 1(a)-1(c), reference numeral 100 designates a vacuum deposition material (pellets of a mixture of SiO, Si, and $SiO_2$), 101 moving base material, 102 an induction heating (RF) coil, 103 an inductively heatable body, 104 a receptacle, 105 a heatproofing plate, 106 insulating brick, 107 a nozzle port, and 108 a wall surface defining the nozzle port 107.

More specifically, the receptacle 104 accommodates the vacuum deposition material 100, and the inductively heatable body 103 has a slit-like nozzle port 107 defined by a wall surface thereof 108. It is through this nozzle port 107 that the vaporized vacuum deposition material is ejected. The receptacle 104 and the inductively heatable body 103 are both made of graphite.

The inductively heatable body 103 is disposed above the receptacle 104 in such a manner that the lower surface of the inductively heatable body 103 is opposed to the surface of the vacuum deposition material 100 at which vaporization occurs.

The periphery of the inductively heatable body 103 and that of the receptacle 104 are covered with the heatproofing plate 105. Outside the receptacle 104, the induction heating coil 102 surrounds the inductively heatable body 103. The receptacle 104 is superposed on the insulating brick 106 as illustrated in FIG. 1(a) and the inductively heatable body 103 is superposed on the receptacle 104 as illustrated in FIGS. 1(b) and (c).

The inductively heatable body 103 is heated with an alternating magnetic field generated by the induction heating coil 102. Consequently, radiation heats the surface of the vacuum deposition material 100 through the space inside the receptacle 104. As a result, $SiO_4$ vapor of the vacuum deposition material 100 issues from the surface of the deposition material. The speed of the SiO vapor is made uniform by the nozzle port 107 in the direction of width, i.e. the direction perpendicular to the surface of the sheet of FIG. 1(a). The vapor thus ejected from the receptacle 104 is deposited on the moving base material 101.

Now, a second embodiment of this invention will be described.

In the second embodiment, a film of SiC is formed on inner surfaces of the receptacle 104 and the inductively heatable body 103 shown in FIGS. 1(a)-1(c).

In the first embodiment at the outset of vacuum deposition, the SiO vapor generated within the receptacle 104 can react with the receptacle 104 and the inductively heatable body 103 thereby producing CO and consequently degrading the degree of vacuum inside the receptacle. The second embodiment is free from this possibility.

The second embodiment, therefore, precludes the possible degradation of the degree of vacuum due to the generation of CO gas and ensures production of a vacuum deposition film of high quality.

Figure 2:
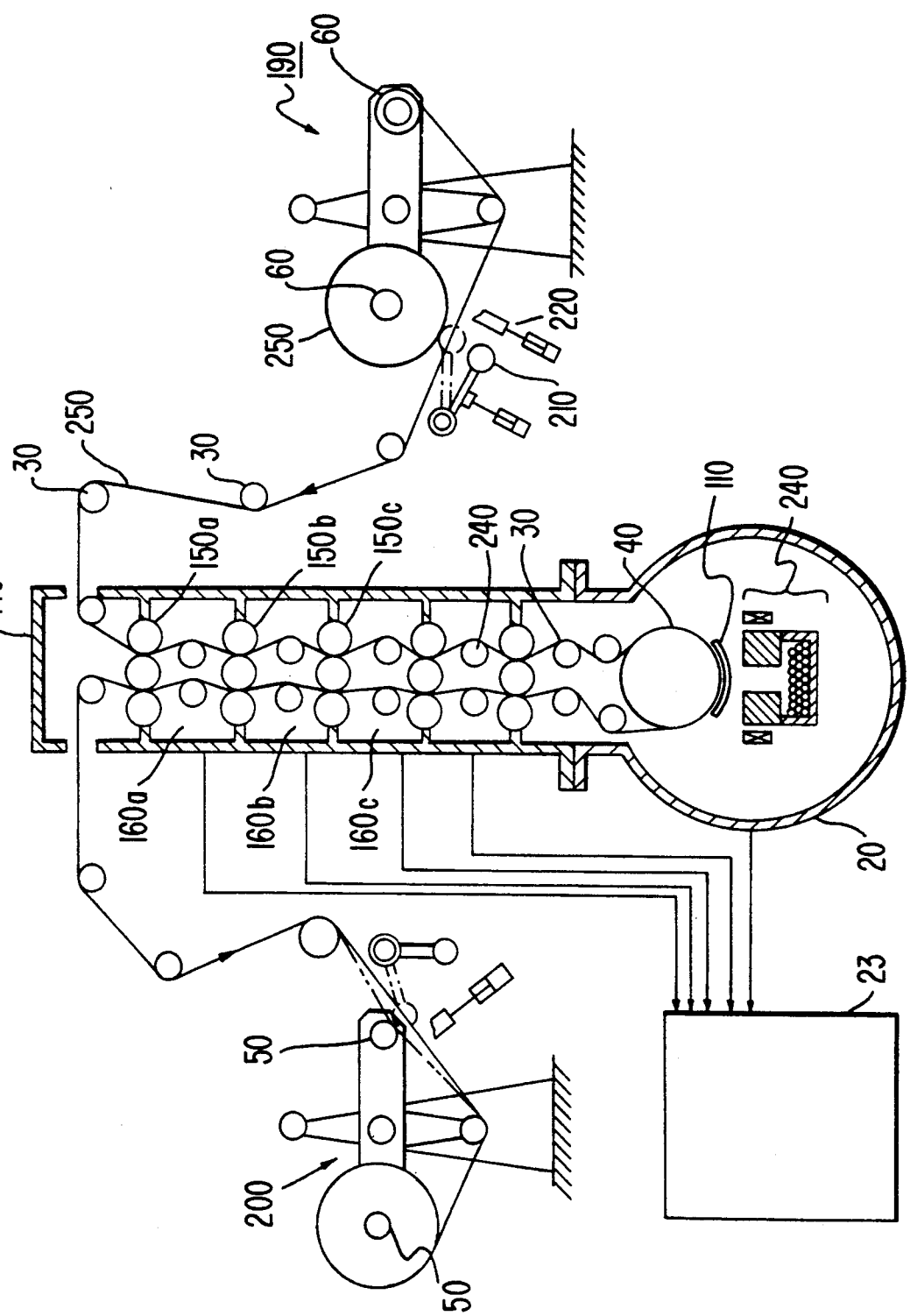
FIG. 2 is a side elevation view, partly in section, of one example of a vacuum deposition apparatus using the vaporizing device of the present invention.
Figure 3:
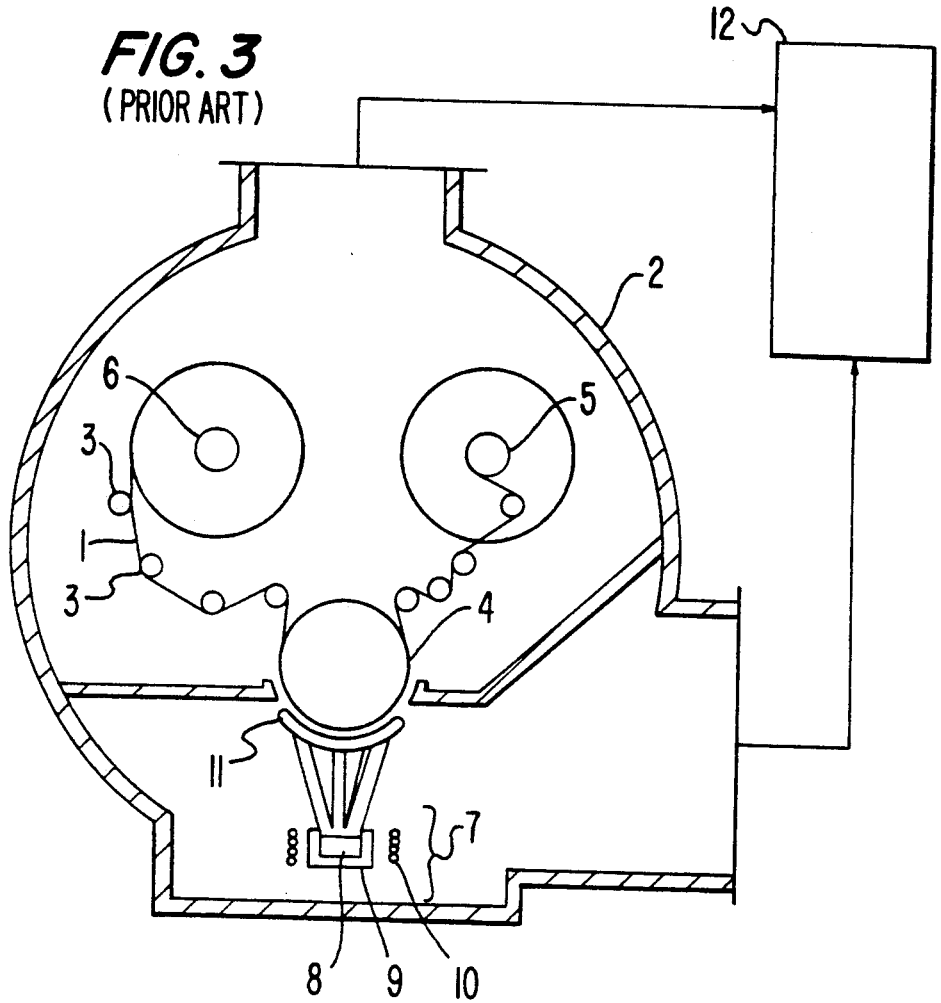
FIG. 3 is a schematic diagram, partly in section, of a vacuum deposition apparatus for vaporizing a sublimative substance according to the prior art.
Figure 4:
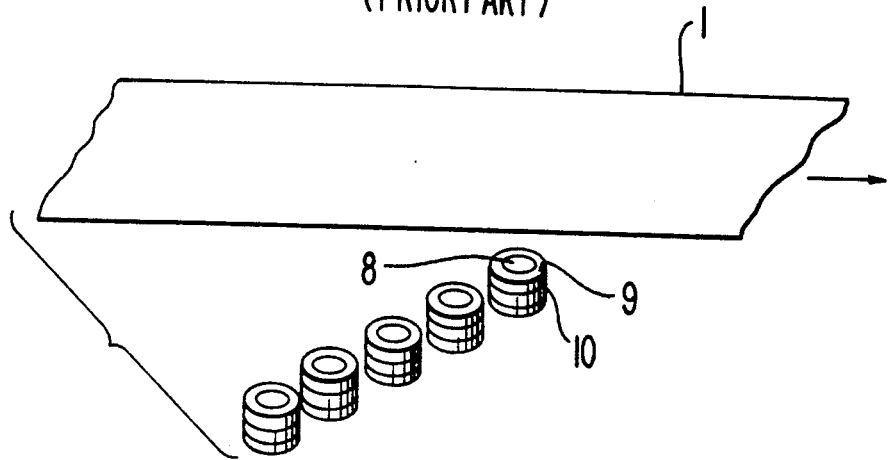
FIG. 4 is an explanatory diagram showing the layout of the receptacles of the device shown in FIG. 3.

Next, referring to FIG. 2, reference numeral 250 designates moving base material, 20 a vacuum deposition chamber, 30 a deflector roll for guiding the moving base material, 40 a cooling roll disposed inside the vacuum deposition chamber 20 50 a takeup reel, 60 an unwinding reel, 240 a vaporizing device disposed inside the vacuum deposition chamber 20 and constructed as illustrated in FIG. 1, and 110 an edge mask similar to what is shown in FIG. 3. A coiler 200 provided with one pair of takeup reels 50 and an uncoiler 190 provided with one pair of unwinding reels 60 are disposed on the opposite sides of the vacuum deposition chamber 20. The base material 250 set on the unwinding reel 60 is passed through pressure chambers 160a, 160b, 160c . . . and around the cooling roll 40 inside the vacuum deposition chamber 20, is guided in the reverse direction through the pressure chambers, and is taken up on the takeup reel 50. Reference numerals 150a, 150b, 150c, . . . designate sets of three seal rolls disposed between the pressure chambers and between the pressure chambers and the vacuum deposition chamber and adapted to pass the moving base material 250 between the nips thereof. A seal device 140 comprises the pressure chamber 160a, 160b, 160c, . . . and the seal rolls 150a, 150b, 150c, . . . Reference numeral 210 designates a pressing roll for pressing the roll of base material 250 on the uncoiler 190, 220 a cutter disposed near the uncoiler 190, and 23 an exhaust pump unit for evacuating the vacuum deposition chamber 20 and the pressure chambers 160a, 160b, 160c . . .

As illustrated in FIG. 2, a roll of the base material 250 is set on one of the pair of reels 60 of the uncoiler 190 and is paid out and advance via deflector rolls to the seal device 140.

The seal device 140 forming the pressure chambers 160a, 160b, 160c, . . . which are partitioned by a plurality of regularly spaced sets 150a, 150b, 150c, . . . of three seal rolls. The exhaust pump unit 230 which is connected to the pressure chambers 160a, 160b, 160c, . . . , produced a pressure gradient from the atmosphere through the vacuum deposition chamber 20 to keep the vacuum deposition chamber 20 under a prescribed degree of vacuum.

The moving base material 250 passes through the gaps between two of the three rolls of each of the sets of seal rolls 150a, 150b, 150c, . . . and then through the pressure chambers 160a, 160b, 160c, . . .

The moving base material 250, while passing over the cooling roll 40, has deposited thereon the vapor rising from the vaporizing device 240. Subsequently, the material 250 is advanced in the opposite direction through the gaps between the other two adjacent rolls of each of the sets of seal rolls 150a, 150b, 150c, . . . and is discharged from the seal device 140.

The base material 250 which has been discharged into the ambient air is rewound on one of the pair of reels 50 of the coiler 190 via deflector rolls 30.

The vacuum deposition apparatus according to the invention enables the sublimative substance to be vacuum-deposited on the moving base material uniformly in the direction of width of the base material while maintaining the quality of the sublimative substance. Further, the temperature of the receptacle need not be elevated unduly and the possible wear of the receptacle can be precluded.

The possibility of the vapor of the vacuum deposition material being condensed and deposited on the inner wall surface of the nozzle is nil because the nozzle is made of an inductively heatable body and the temperature of the nozzle is kept above the temperature of the surface at which vaporization occurs.

What is claimed is:

1. A device for vaporizing a sublimative substance, said device comprising: a receptacle having an open upper end; an inductively heatable graphite body covering the open upper end of said receptacle, said graphite body having a slit extending through a central part thereof and open to the interior of said receptacle, said slit having a cross-sectional area smaller than that of the interior of said receptacle such that the central part of said graphite body forms a nozzle through which vapor produced from a sublimative substance accommodated in said receptacle will be ejected; and an RF coil of an induction heater extending around said graphite body.

2. A device for vaporizing a sublimative substance as claimed in claim 1, wherein said receptacle has an inner surface of SiC.

3. A device for vaporizing a sublimative substance as claimed in claim 1, wherein said coil extends only around said graphite body of the device and is the only heating element of the device, and said graphite body has a bottom surface exposed to the interior of the receptacle at the upper end thereof such that heat emanating from said surface will produce the highest temperature in a sublimative substance accommodated in the receptacle at an uppermost surface of such substance.

* * * * *